(12) United States Patent
Strütt et al.

(10) Patent No.: US 12,498,411 B2
(45) Date of Patent: Dec. 16, 2025

(54) ELECTRONIC UNIT AND METHOD FOR TESTING AT LEAST ONE STATE OF AN ELECTRONIC UNIT

(71) Applicant: Endress+Hauser SE+Co. KG, Maulburg (DE)

(72) Inventors: Bernd Strütt, Steinen (DE); Christian Strittmatter, Rickenbach (DE); Christoph Hippin, Grenzach-Wyhlen (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 120 days.

(21) Appl. No.: 18/247,021

(22) PCT Filed: Sep. 13, 2021

(86) PCT No.: PCT/EP2021/075122
§ 371 (c)(1),
(2) Date: Mar. 28, 2023

(87) PCT Pub. No.: WO2022/069204
PCT Pub. Date: Apr. 7, 2022

(65) Prior Publication Data
US 2023/0366921 A1 Nov. 16, 2023

(30) Foreign Application Priority Data
Oct. 1, 2020 (DE) ...................... 10 2020 125 716.3

(51) Int. Cl.
*G01R 31/28* (2006.01)
*H05K 1/02* (2006.01)

(52) U.S. Cl.
CPC ....... *G01R 31/2801* (2013.01); *H05K 1/0268* (2013.01); *H05K 2201/10174* (2013.01)

(58) Field of Classification Search
None
See application file for complete search history.

(56) References Cited

U.S. PATENT DOCUMENTS 4,709,253 A * 11/1987 Walters ................... H01L 24/83
257/E21.511
5,024,372 A * 6/1991 Altman ................... H01L 24/11
257/E21.511

(Continued)

FOREIGN PATENT DOCUMENTS

DE 102008031633 B4 4/2010
DE 102010029234 A1 11/2011

(Continued)

OTHER PUBLICATIONS

Fukuda Takashi; Diagnosing Device, Diagnosing Method and Diagnosing Program for Electronic Device Having Solder-Jointed Portion; Publication Date: Dec. 11, 2008; Fujitsu Ltd [JP]; Fukuda Takashi [JP]; WO2008149445A1; CPC G01N27/20 (Year: 2008).*

*Primary Examiner* — Nasima Monsur
(74) *Attorney, Agent, or Firm* — Brannon Sowers & Cracraft PC

(57) ABSTRACT

An electronic unit includes at least one component and a printed circuit board, wherein the at least one component has at least one terminal. The printed circuit board has at least one first contact surface and at least one second contact surface, wherein the at least one first contact surface and the at least one second contact surface are spaced apart from one another. The at least one terminal is joined to the at least two contact surfaces by at least one solder joint. A method for testing at least one state of an electronic unit is also disclosed.

13 Claims, 2 Drawing Sheets

(56) References Cited

U.S. PATENT DOCUMENTS

| | | | | |
|---|---|---|---|---|
| 5,315,070 A | * | 5/1994 | Maiwald | H05K 3/3452 |
| | | | | 174/250 |
| 2002/0125043 A1 | | 9/2002 | Yoshida | |
| 2003/0042618 A1 | | 3/2003 | Nose et al. | |
| 2003/0173109 A1 | * | 9/2003 | Suehiro | H01L 24/81 |
| | | | | 174/262 |
| 2005/0006140 A1 | * | 1/2005 | Birgel | H05K 3/363 |
| | | | | 174/262 |
| 2008/0245554 A1 | * | 10/2008 | Pan | H05K 3/3436 |
| | | | | 361/767 |
| 2012/0025863 A1 | * | 2/2012 | Ochs | H05K 1/0268 |
| | | | | 257/E23.002 |
| 2018/0042112 A1 | * | 2/2018 | Chen | H05K 3/3442 |

FOREIGN PATENT DOCUMENTS

| | | |
|---|---|---|
| DE | 102010038453 A1 | 2/2012 |
| JP | H05347473 A | 12/1993 |
| JP | 2001077518 A | 3/2001 |
| WO | 2008149445 A1 | 12/2008 |

\* cited by examiner

ELECTRONIC UNIT AND METHOD FOR TESTING AT LEAST ONE STATE OF AN ELECTRONIC UNIT

CROSS-REFERENCE TO RELATED APPLICATIONS

The present application is related to and claims the priority benefit of German Patent Application No. 102020125716.3, filed on Oct. 1, 2020, and International Patent Application No. PCT/EP2021/075122, filed Sep. 13, 2021, the entire contents of which are incorporated herein by reference.

TECHNICAL FIELD

The invention relates to an electronic unit comprising at least one component and a printed circuit board. Furthermore, the invention relates to a method for testing at least one state of an electronic unit, which unit comprises at least one component and one printed circuit board.

BACKGROUND

In process and automation engineering, multiple field devices are used to determine and/or monitor process variables. In principle, all devices that are used in-process and that supply or process process-relevant information are referred to as field devices. These are, for example, fill-level measuring devices, flow meters, pressure and temperature measuring devices, pH and redox potential meters, conductivity meters, etc., which are used for recording the respective process variables, such as fill level, flow, pressure, temperature, pH level, redox potential or conductivity. Field devices often have a sensor unit which is in contact with a process medium at least temporarily and/or at least in portions and which serves to generate a signal dependent on the process variable. Furthermore, field devices often have an electronic unit arranged in a housing, wherein the electronic unit serves to process and/or forward the signals generated by the sensor unit, in particular electrical and/or electronic signals. For this purpose, the electronic unit often has a printed circuit board with components arranged thereon.

The printed circuit board frequently has a plurality of contact surfaces which are soldered to the terminals of the components. The terminals of the components and the contact surfaces of the circuit boards serve for mechanical and/or electrical contact between the printed circuit board and the component. After the soldering of the terminals to the contact surfaces, an automatic optical inspection (AOI) of the printed circuit board usually takes place. In this case, a check is made, inter alia, as to whether all required components are present on the printed circuit board, and whether the solder joints have defects. However, the latter is only possible if the solder joints are optically visible from the outside, i.e., when the solder joints are not arranged between the printed circuit board and the component. In the non-visible, concealed solder locations, an automatic X-ray inspection (AXI) can be performed in order to detect, for example, unwanted air inclusions, so-called voids, within the solder joint. However, the AXI is a relatively complex and expensive method compared to AOI.

So-called trailers, that is to say components which only rest on the printed circuit board without being properly soldered to the printed circuit board, are not detected with AOI or with AXI. Trailers occur, for example, when the component has not been sufficiently wetted by the solder paste due to excessively low temperatures, vibrations or the like. Such a defective solder joint is also known as a cold solder joint.

Electronic units are designed to be partially intrinsically safe, i.e., only those sparks may be produced that do not cause an ignition of explosive mixtures. In the simplest case, this can be achieved by limiting the current and/or the voltage. For the current and/or voltage limitation, resistors or Zener diodes are used, for example. In order to ensure the intrinsic safety of the electronic unit, a check of the solder joint between the printed circuit board and the current-limiting and/or voltage-limiting element is imperative. In the case of concealed solder joints, the aforementioned challenges arise.

SUMMARY

The object of the present invention is therefore to specify an electronic unit and a method by means of which a concealed solder joint can be checked in a simple manner.

The object is achieved according to the invention by an electronic unit comprising at least one component and a printed circuit board, wherein the at least one component has at least one terminal, wherein the printed circuit board has at least one first contact surface and at least one second contact surface, wherein the at least one first contact surface and the at least one second contact surface are spaced apart from one another, wherein the at least one terminal is joined to the at least two contact surfaces by means of at least one solder joint.

Before the at least one component is soldered to the printed circuit board, the solder paste is either applied to the first contact surface and the second contact surface, or the solder paste is applied to at least two separate regions of the at least one terminal, wherein the at least two separate regions face the first contact surface and the second contact surface, respectively. If the component is missing during the soldering process, the melting of the solder paste leads only to two solder deposits that are separate from one another. Thus, no electrical connection is created between the first contact surface and the second contact surface. The solder paste is applied in each case to the first contact surface and the second contact surface or to the at least one terminal such that, during soldering of the printed circuit board, an electrical connection is created between the first and second contact surfaces only in combination with the at least one component.

When at least one component is present during the soldering process, the heating and melting of the solder paste or solder paste deposits leads either to a common solder joint, which, as a soldering bridge, leads from the first contact surface via the terminal to the second contact surface, or to two separate solder joints, wherein in each case a contact surface is joined separately to the terminal. Separate solder joints arise depending on the distance of the solder paste or the contact surfaces from one another and from the interaction between the solder paste and the surface of the printed circuit board between the two contact surfaces, which depend on the nature of the surface of the printed circuit board. Instead of two solder paste deposits, a plurality of, for example four, solder paste deposits can also be applied to the at least one terminal or to the contact surfaces. In addition, a terminal can also be soldered to three or more contact surfaces, for example.

With the electronic unit according to the invention, the at least one solder joint can be checked in a simple manner.

Thus, an electrical input signal can be applied to a contact surface and an electrical output signal can be determined at another contact area. Only when the solder joint mechanically and/or electrically joins the component and the printed circuit board is a defined target value of an electrical output signal received.

A further advantage of the electronic unit according to the invention is that the division of the contacting of the terminal with at least two contact surfaces reduces a tilting of the at least one component relative to the printed circuit board. If a component having one or a few terminals is soldered to a printed circuit board in a conventional sense, i.e., one terminal is soldered to each contact surface, an unequal distribution of the solder paste between the terminal and the contact surface can occur during the remelting process. As a result, a larger solder gap height is formed in some regions of the solder joint and a lower solder gap height is formed in other regions of the solder joint, and the component is thereby tilted relative to the printed circuit board. By distributing the solder paste between at least two contact surfaces and a terminal, this effect is reduced and an almost parallel alignment of the component with respect to the printed circuit board is achieved.

In one possible embodiment, the at least two contact surfaces are separated from one another by a solder stop. The solder stop is in particular a solder resist material or a solder resist film. The solder stop prevents the area of the printed circuit board covered with solder stop from being wetted with solder. The solder stop can optionally be used to delimit the contact surfaces with respect to one another and can influence the orientation of the component relative to the printed circuit board.

In a further possible embodiment, the component is a voltage limiting element. In particular for voltage limiting elements which are mounted on the printed circuit board in the context of explosion protection, the solder joint between the voltage limiting element and the circuit board must be checked and the mechanical and/or electrical connection ensured by means of the at least one solder joint between the voltage limiting element and the circuit board.

Preferably, the component is a Zener diode.

The object of the invention is further achieved by a method for testing at least one state of an electronic unit which comprises at least one component and a printed circuit board, wherein the at least one component has at least one terminal, wherein the printed circuit board has at least one first contact surface and at least one second contact surface, wherein the at least one first contact surface and the at least one second contact surface are spaced apart from one another, wherein the at least one terminal is joined to the at least two contact surfaces by means of at least one solder joint, wherein the method comprises at least the following steps:

applying an electrical input signal to the at least one first contact surface, determining an electrical output signal on the at least one second contact surface, determining the at least one state of the electronic unit on the basis of the electrical input signal and the electrical output signal.

The method thus serves for indirect checking of the at least one solder joint and is particularly advantageous in the case of concealed solder joints, which are not easily accessible, for example, with AOI and/or AXI. Starting from at least one intact solder joint, which ensures a mechanical and/or electrical connection between the at least one component and the printed circuit board, it is defined as to which target value of the electrical output signal on the second contact surface is to be determined when an electrical input signal is applied to the first contact surface. If the specific electrical output signal matches the previously defined target value, an intact solder point is present. If the defined target value is not reached, a cold solder joint is present, for example. The contact surfaces of the printed circuit boards are generally designed as end points, also called test points, of conductor tracks, which enable the application and determination of the electrical input and output signals in a simple manner. The method can be used, for example, during the manufacturing process of the electronic unit. It can furthermore be used to examine the electronic unit for damage after an operation thereof.

In one possible embodiment, the presence of the component and/or the electrical contactability of the component and/or a solder paste of the solder joint is determined as the at least one state. It can be recognized from a comparison of the electrical input signal and the electrical output signal whether the component is still present, i.e., whether it is mechanically joined to the printed circuit board via the at least one solder joint. This is relevant, not only during the manufacture of the electronic unit, but can also be relevant, for example, after an error of the electronic unit has occurred. For example, the at least one solder joint can break as a result of external impact. Likewise, the electrical contactability of the component can be determined by means of the contact surfaces of the printed circuit boards in order thus to check the functionality of the component. Furthermore, it is possible to determine the solder paste used in the solder joint. In this case, damage to the component can be determined indirectly because a minimum melting temperature is associated with each solder paste. When using a solder paste having a melting temperature for which the component is not designed, the function of the component can be impaired.

Advantageously, a voltage or a resistance is determined as an electrical output signal. If at least one intact solder joint is present which joins the at least one component and the printed circuit board, a voltage is also obtained on the second contact surface when a voltage is applied to the first contact surface. If a resistance between the first and second contact surfaces is determined, a significantly greater resistance is obtained in the case of a non-intact solder joint than in the case of an intact solder joint.

Preferably, the method is carried out during a functional testing of the electronic unit. The method can be implemented as part of a functional test without additional effort in conventional production.

BRIEF DESCRIPTION OF THE DRAWINGS

The present invention will be explained below with reference to the following FIG. 1-2. In the figures.

The electronic unit 1 according to the invention comprises at least one component 2 and a printed circuit board 3. For example, the electronic unit 1 according to the invention is used in the field devices mentioned at the outset, wherein there is no limitation to the aforementioned examples.

DETAILED DESCRIPTION

Figure 1A:
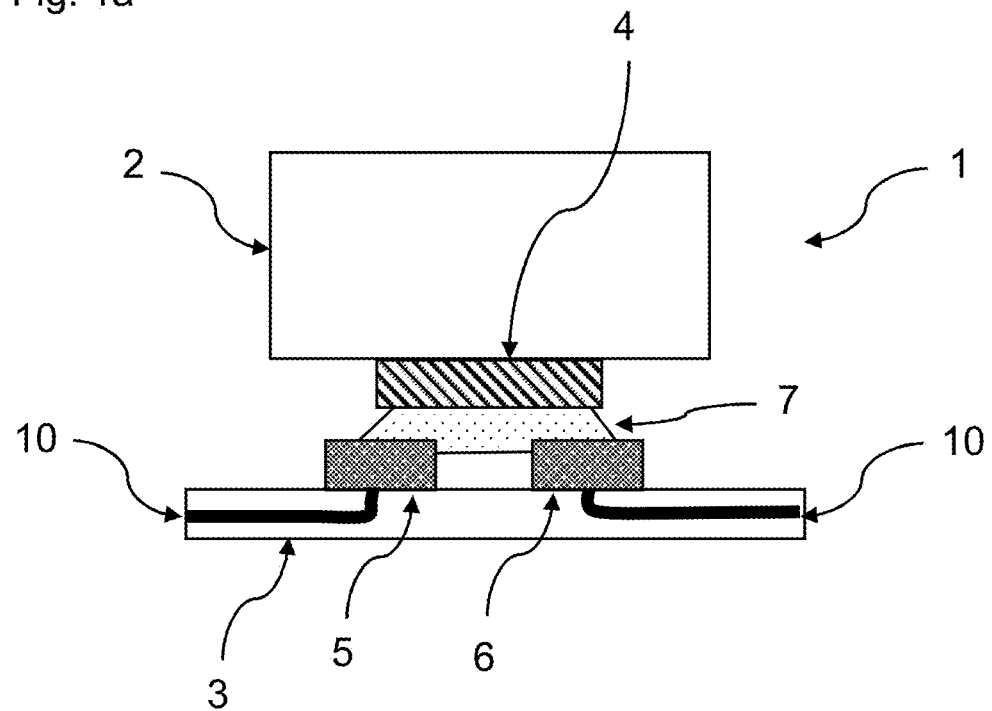
FIG. 1a shows a side view of an electronic unit according to the present disclosure.

FIG. 1a shows a possible embodiment of the electronic unit 1 according to the invention in a cross-sectional view, in which the electronic unit 1 has a component 2 and a printed circuit board 3. However, a plurality of components 2 can also be arranged on the printed circuit board 3 and joined thereto. In the embodiment shown, the component 2 has a terminal 4 and the printed circuit board 3 has a first and second contact surface 5, 6 which are joined via a solder joint 7. Within the scope of the invention, the component 2 can also have a plurality of terminals 4. It is also possible to join a terminal 4 with more than two contact surfaces 5, 6. It is also possible for the 6 terminal 4 to be joined to the two contact surfaces 5, 6 via two separate solder joints. However, the contact surfaces 5, 6 are always spaced apart from one another. By way of example, conductor tracks 10 are shown which end in the two contact surfaces 5, 6. The component 2 can, for example, be a voltage limiting element, such as a Zener diode.

Figure 1B:
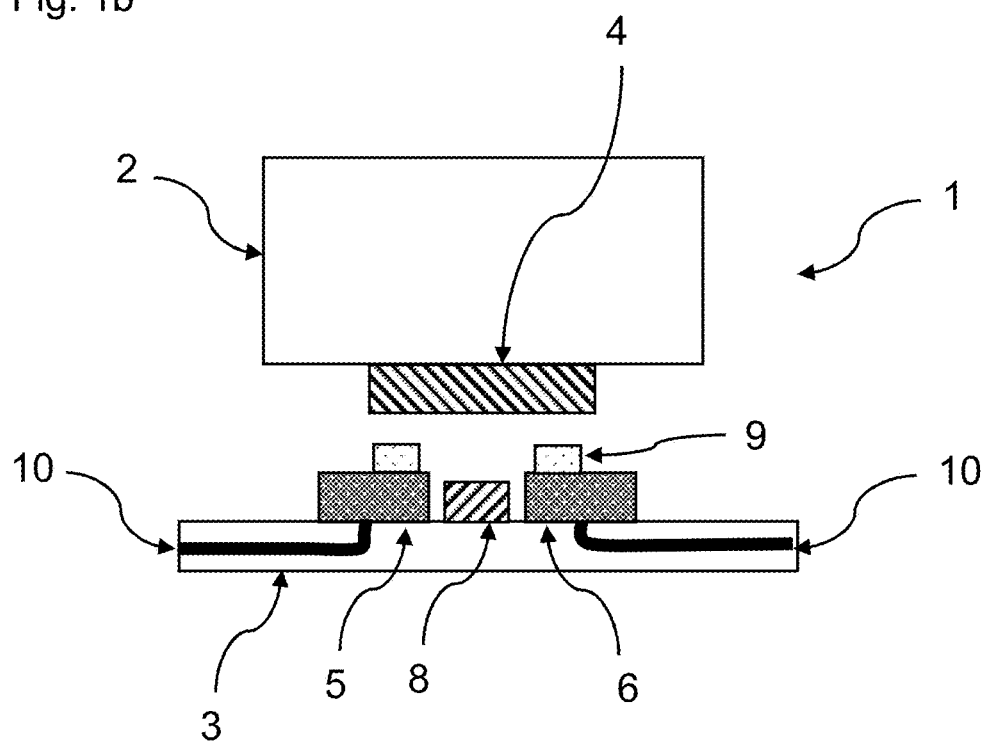
FIG. 1b shows a side view of an electronic unit according to the present disclosure before the soldering process.

FIG. 1b shows the electronic unit 1 according to the invention before the at least one component 2 is soldered to the printed circuit board 3. It should be noted here that the solder paste 9 is applied to the first and second contact surfaces 5, 6 or the at least one terminal 4 in such a way that an electrical connection between the first and second contact surfaces 5, 6 is created only when both the printed circuit board 3 and the at least one component 2 are present during the soldering process. In the exemplary embodiment in FIG. 1b, the solder paste 9 is applied to the first and second contact surfaces 5, 6, respectively. However, the solder paste 9 can also be applied to the at least one terminal 4. By way of example, a solder stop 8 is applied between the contact surfaces 5, 6 in order to adjust the orientation of the component 2 relative to the printed circuit board 3.

Figure 2:
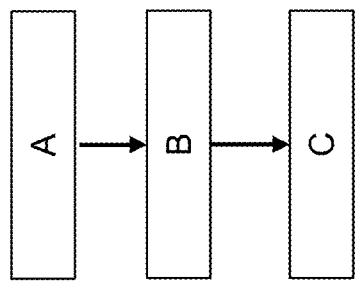
FIG. 2 shows an exemplary embodiment of the method according to the present disclosure.

FIG. 2 shows an exemplary embodiment of the method according to the invention. The method can be used for an electronic unit 1, which comprises at least one component 2 and a printed circuit board 3, and which is shown in FIG. 1. The at least one component 2 has at least one terminal 4. The printed circuit board 3 has at least one first contact surface 5 and at least one second contact surface 6, which are spaced apart from one another. The at least one terminal 4 is joined to the at least two contact surfaces 5, 6 by means of at least one solder joint 7. In the first step A, an electrical input signal is applied to the at least first contact surface 5. In the second step B, an electrical output signal, for example a voltage or a resistance, is determined on the at least second contact surface 6. For example, the application of the first input signal and/or the determination of the electrical output signal can take place by means of two conductor tracks 10 which terminate at the contact surfaces. In the third step C, at least one state of the electronic unit 1, such as the presence of the component 2 and/or the electrical contactability of the component 2 and/or a solder paste of the solder joint 7, is determined on the basis of the electrical input signal and the electrical output signal. Optionally, the method can be used in production during a functional test.

The invention claimed is:

1. A method for testing at least one state of an electronic unit, the method comprising:
   providing an electronic unit comprising:
      at least one component, which includes at least one terminal; and
      a printed circuit board, which includes one first contact surface forming an end point of a first conductor track arranged in the printed circuit board, and a second contact surface forming an end point of a second conductor track arranged in the printed circuit board,
      wherein the first contact surface and the second contact surface are spaced apart from one another, and
      wherein the at least one terminal is separately joined to both the first contact surface and the second contact surface by exactly one solder joint,
      wherein an electrical connection between the first and second contact surfaces is created only when both the printed circuit board and the at least one component are present during the soldering process, and the electrical connection is formed only in combination with the at least one component after the at least one component is joined to the first contact surface and the second contact surface by way of the soldering process;
      wherein the first contact surface and the second contact surface are separated from one another by a solder stop, such that an area of the printed circuit board between the first contact surface and the second contact surface is not wetted by solder forming the solder joint;
   applying an electrical input signal to the first contact surface;
   determining an electrical output signal on the second contact surface; and
   determining the at least one state of the electronic unit based on the electrical input signal and the electrical output signal;
   wherein the at least one state includes a presence of the at least one component.

2. The method of claim 1, wherein a voltage or a resistance is determined as an electrical output signal.

3. The method of claim 1, wherein the method is performed during a functional test of the electronic unit.

4. The method of claim 1 wherein the at least one component includes a voltage limiting element.

5. The method of claim 4 wherein the at least one component includes a Zener diode.

6. The method of claim 1 wherein the determining the presence of the component includes receiving a defined target value of the electrical output signal based on the solder joint joining the component to the first and second contact surfaces.

7. A method for testing at least one state of an electronic unit comprising:
   applying an electrical input signal to a first contact surface of a printed circuit board forming an end point of a first conductor track arranged in the printed circuit board and electrically connected by way of a first solder joint to at least one terminal of a component;
   determining an electrical output signal on a second contact surface of the printed circuit board forming an end point of a second conductor track arranged in the printed circuit board and electrically connected to the at least one terminal by way of a second solder joint; and
   determining the at least one state of the electronic unit based on the electrical input signal and the electrical output signal;
   wherein the electrical output signal includes a voltage or a resistance; and
   wherein the first contact surface and the second contact surface are separately joined to the at least one terminal, wherein an electrical connection between the first and second contact surfaces is created only when both the printed circuit board and the at least one component are present during the soldering process, and the electrical connection is formed only in combination with the at least one component after the at least one component is joined to the first contact surface and the second contact surface by way of the soldering process.

8. The method of claim 7 wherein the determining the at least one state of the electronic unit includes determining a presence of the component.

9. The method of claim 7 wherein the determining the at least one state of the electronic unit includes determining an electrical contactability of the component.

10. The method of claim 7 wherein the determining the at least one state of the electronic unit includes determining a type of a solder paste forming the solder joint.

11. The method of claim 7 wherein the solder joint includes a concealed joint.

12. The method of claim 11 wherein the first contact surface and the second contact surface are separated by a solder stop.

13. The method of claim 11 wherein the component includes a Zener diode.

* * * * *